(12) United States Patent
Han et al.

(10) Patent No.: US 6,406,931 B1
(45) Date of Patent: Jun. 18, 2002

(54) STRUCTURAL TUNING OF RESIDUAL CONDUCTIVITY IN HIGHLY MISMATCHED III-V LAYERS

(75) Inventors: Jung Han; Jeffrey J. Figiel, both of Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/416,385

(22) Filed: Oct. 12, 1999

(51) Int. Cl.$^7$ .............................................. H01L 21/00
(52) U.S. Cl. ....................................................... 438/46
(58) Field of Search ........................ 438/46, 47, 479, 438/509, 938, 967; 117/952

(56) References Cited

U.S. PATENT DOCUMENTS 5,290,393 A * 3/1994 Nakamura .................. 438/509

OTHER PUBLICATIONS

Ebel, R. et al., "Buffer layers for the growth of GaN on sapphire by molecular beam epitaxy", J Crystal Growth pp. 433–436, May 1999.*

* cited by examiner

*Primary Examiner*—Keith Christianson
(74) *Attorney, Agent, or Firm*—Brian W. Dodson; Kevin W. Bieg

(57) ABSTRACT

A new process to control the electrical conductivity of gallium nitride layers grown on a sapphire substrate has been developed. This process is based on initially coating the sapphire substrate with a thin layer of aluminum nitride, then depositing the gallium nitride thereon. This process allows one to controllably produce gallium nitride layers with resistivity varying over as much as 10 orders of magnitude, without requiring the introduction and activation of suitable dopants.

16 Claims, 5 Drawing Sheets

STRUCTURAL TUNING OF RESIDUAL CONDUCTIVITY IN HIGHLY MISMATCHED III-V LAYERS

This invention was made with Government support under Contract DE-AC04-94DP85000 awarded by the U.S. Department of Energy. The Government has certain rights in the invention.

BACKGROUND

The present invention relates generally to the growth of compound semiconductor thin films, and more specifically to controlling certain properties thereof by introduction of buffer layers.

The III–V semiconductors are known for the versatility of their electronic and photonic properties, relatively easy growth processes, and, in most cases, ease of doping. As a result, they form the basis for much of current optoelectronics.

The GaN system, by which is meant gallium nitride itself and III–V semiconductor alloys based on gallium nitride, but which include additional III–V components, such as In, Al, or As. These alloys can be ternary alloys, quaternary alloys, or still more complex alloys. The main requirement is that they can be deposited with a single crystal structure, that is, without separation into distinguishable phases.

Unique among the III–V semiconductors, the GaN system includes alloys with bandgaps reaching far into the ultraviolet. $Al_{0.9}Ga_{0.1}N$ has a bandgap of about 6 electron volts, corresponding to a photon wavelength of about 0.18 $\mu$m (visible light is from 0.4 to 0.7 $\mu$m). Accordingly, these materials are of great interest in the development of ultraviolet photonic devices.

In particular, GaN system devices which emit light are of primary interest, as alternate sources of monochromatic or near-monochromatic photons are either unavailable or inappropriate for widespread use.

At this point, both GaN-based light emitting diodes (LEDs) and GaN-based laser diodes (LDs) have been demonstrated, with function restricted to the 2–3 eV regime (roughly 0.35 $\mu$m to 0.5 $\mu$m emission). This limitation is essentially structural in nature.

It is a challenge to grow the GaN system in large single crystal form, so it is difficult to develop devices which are structurally and chemically matched to their substrate. Further, the GaN system has quite short lattice constants compared to the other III–V materials, so using a closely related hetero-substrate is not a practical option either.

As is often done in such cases, a search is made for a substrate with good intrinsic qualities, and upon which the desired material will grow epitaxially, even though the crystal structure and orientation may differ dramatically. In this case, considerable success has been achieved by growing thick (~3 $\mu$m) layers of GaN on sapphire substrates. This causes the generation of a variety of structural defects in the GaN-based layer, but the layer is epitaxial, nearly totally relaxed to its nominal lattice constant, and structurally consistent across the substrate. This thick layer of GaN then serves as a pseudo-substrate for device growth and fabrication.

Typically, however, fabrication of devices does not simply require a mechanically and chemically compatible substrate surface, but also makes particular requirements on the electronic structure and properties of the substrate, it is well-known that, even when extrinsic dopants are not added, an as-grown GaN film on sapphire usually exhibits slightly n-type behavior, with equivalent carrier electron densities of $10^{16}$ to $10^{18}$ cm$^{-3}$ or more. These residual electrons are not associated with defects of uniform structure, nor are they well-understood. It is believed that these residual electrons are associated with the various structural defects characteristic of the highly defective GaN on sapphire lattice structure.

Given that some types of electronic devices require layers with well characterized dopant levels having concentrations as low as $10^{17}$ cm$^{-3}$, it can be seen that the uncompensated levels found in GaN on sapphire can dramatically alter, or even dominate, the desired device structure.

There has not previously been a clear correlation between how the GaN layer was grown (e.g., temperature, rate, presence of a buffer layer, etc.) and the residual electron density. As a result, attempts to compensate the residual electron density by adding p-type dopants (typically Mg) have generally failed, first by misestimating the amount of Mg dopant to add, second by the extremely poor activation properties of Mg in the GaN system, and finally by changes in the degree of Mg activation in further processing steps.

The end result of these difficulties is that prior art GaN-based devices have generally exhibited reduced performance (at times degraded to nonfunctionality) when grown on substrates comprising a large layer of GaN on a sapphire wafer. However, for the reasons summarized above, such a pseudo-substrate is the best choice for a variety of reasons. There is therefore a need for a procedure or treatment which will (at least) render it possible to reliably and robustly reduce the level of residue electrons in a layer of GaN grown on sapphire to levels that do not compromise device performance or manufacturability. More generally, there is a need for a procedure or treatment which can control the level of residue electrons in such a pseudo-substrate to a desired level.

SUMMARY OF THE INVENTION

The present invention relates to methods to design and grow GaN-based layers on a sapphire substrate so that the residue electron density can be controlled to a desired value. This is accomplished by introducing a buffer layer of low temperature deposited AlN between the sapphire and the GaN layer. All other growth parameters being equal, the thickness of the AlN layer will determine the final residue electron density. Alternately, the residue electron density can be controlled by varying the length and temperature of an annealing step introduced after the AlN layer is grown, but before the GaN layer is grown on top. GaN layers having nominally identical structure and chemistry can thereby be grown with resistivity values ranging from essentially intrinsic properties to below ~0.1 Ω-cm.

DETAILED DESCRIPTION

Figure 1:
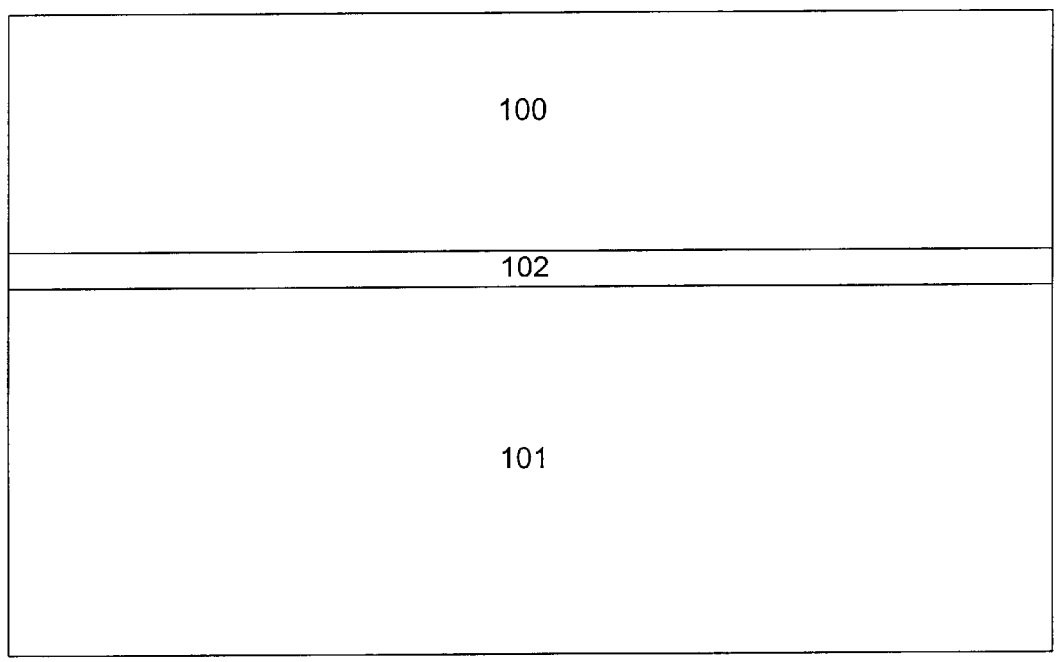
FIG. 1 shows a schematic diagram of a thick layer of GaN grown on a sapphire substrate with an intermediate AlN buffer layer.

The instant invention teaches how to control the residual conductivity of a thick layer 100 of GaN grown (see FIG. 1) on a sapphire substrate 101 by introducing a carefully tailored buffer layer 102 of AlN between the sapphire and the GaN.

The thickness of the AlN layer changes the proportion of screw misfit dislocations to edge misfit dislocations which propagate into the GaN layer. Because edge and screw dislocations have different charge states and charging energies, the residual carrier density of the GaN layer might vary with the absolute and relative densities of these dislocations. Unfortunately, current theoretical techniques are not capable of predicting the outcome in actual III–V semiconductors.

A series of demonstration structures were grown by Applicants to show how to carry out the instant invention. The substrates used were (0001) oriented single crystal sapphire. After normal surface cleaning and preparation procedures, a layer of AlN was grown via a standard MOCVD process on the sapphire surface. The growth temperature was about 480° C., and the growth rate was 2.33 Å/second. (The significance of these values, and the consequences of varying them, will be described later.) The layer thickness, which was the control variable for this study, was varied between about 140 Å and about 320 Å.

After the AlN layer was grown, a GaN layer some 2 microns in thickness was grown on top of the AlN buffer layer. This layer was also grown using a standard MOCVD procedure, with a growth temperature of about 1050° C.

Figure 2:
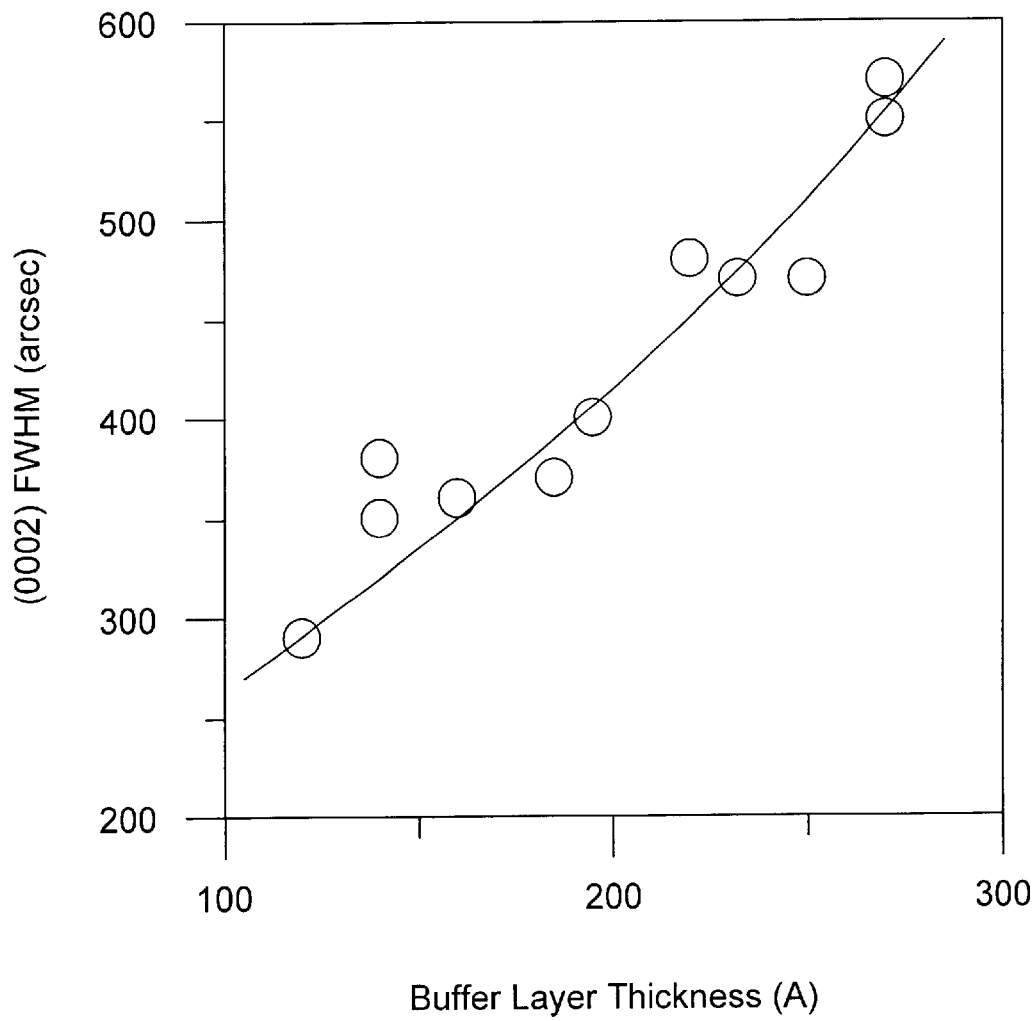
FIG. 2 shows a graph of the full width at half maximum (FWHM) (0002) x-ray diffraction rocking curve linewidths of the GaN layer as a function of AlN buffer layer thickness.
Figure 3:
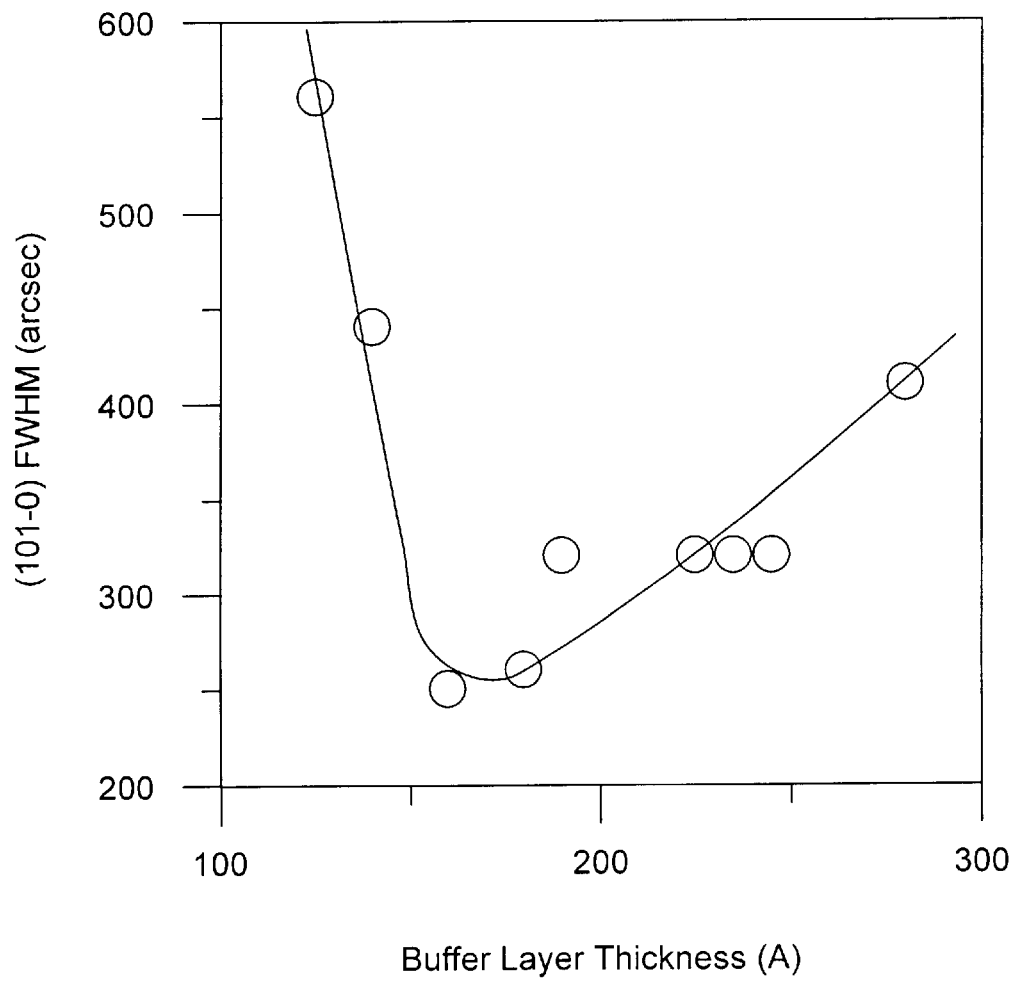
FIG. 3 shows a graph of the FWHM (101-0) linewidths of the GaN layer as a function of AlN buffer layer thickness.

The dependence of the resulting structures on the AlN buffer layer thickness appears in FIGS. 2 and 3. FIG. 2 shows the full width at half maximum (FWHM) (0002) linewidths obtained from x-ray diffraction rocking curve measurements. The (0002) diffraction linewidth measures the amount of relative tilt among the GaN crystallites and the closely related density of dislocations with a screw component. Roughly speaking, a broader diffraction line corresponds to a more highly defective sample.

FIG. 3 shows the FWHM (101-0) linewidths for the same samples. The (101-0) linewidth measures the amount of twisting around the c-axis, and the related density of edge dislocations.

The density of screw dislocations (FIG. 2) increases monotonically and nearly linearly with the thickness of the AlN buffer layer. In contrast, the density of edge dislocations is high for a 140 Å AlN buffer layer, but decreases for thicker layers, passing through a minimum in edge dislocation density for about a 240 Å layer, then increasing back to nearly the original density for the thickest layer studied (some 320 Å). The net result is that the relative proportion of edge to screw dislocations varies by a factor of about 2.5 in this regime of buffer layer thicknesses.

Figure 4:
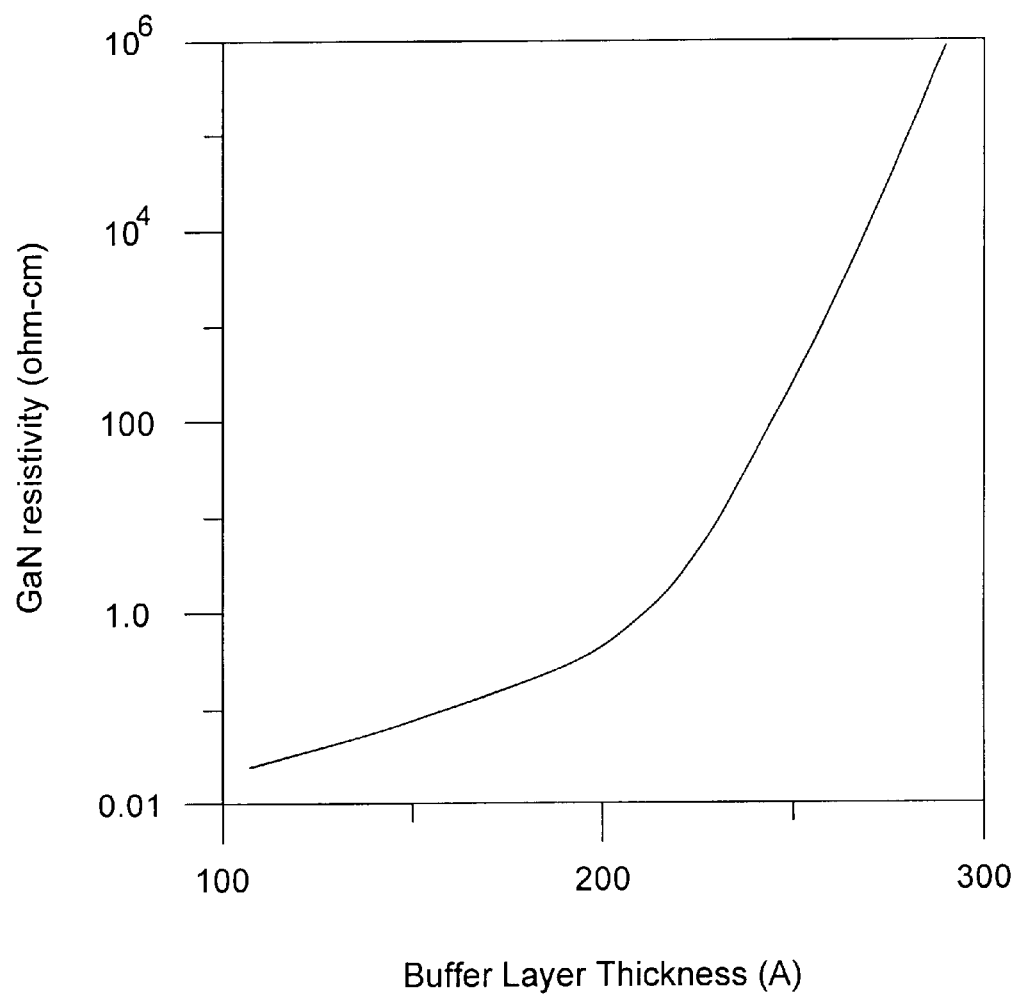
FIG. 4 shows a graph of the GaN layer resistivity as a function of the AlN buffer layer thickness.

Applicants were surprised by both the magnitude of the effect the dislocations had on the GaN resistivity, and by the specificity of the effect. It appears that the density of screw dislocations dominates the resistivity effect. This is indicated in FIG. 4, where GaN resistivity is plotted as a function of the (0002) FWHM rocking curve linewidth. Samples with fewer screw dislocations ((0002) FWHM from 270–400 arcseconds) were typically highly conducting, with resistivities less than 0.1 Ω-cm.

At larger (0002) FWHM values, the sample resistivity begins to rise rapidly, reaching values of 10–100 Ω-cm at ~500 arcseconds, and diverging into highly resistive films ($>10^6$ Ω-cm ) for (0002) linewidths greater than about 550 arcseconds. These highly resistive films also have the property that it is difficult to make ohmic contact with them, as one would expect for a material with essentially no free carriers.

Figure 5:
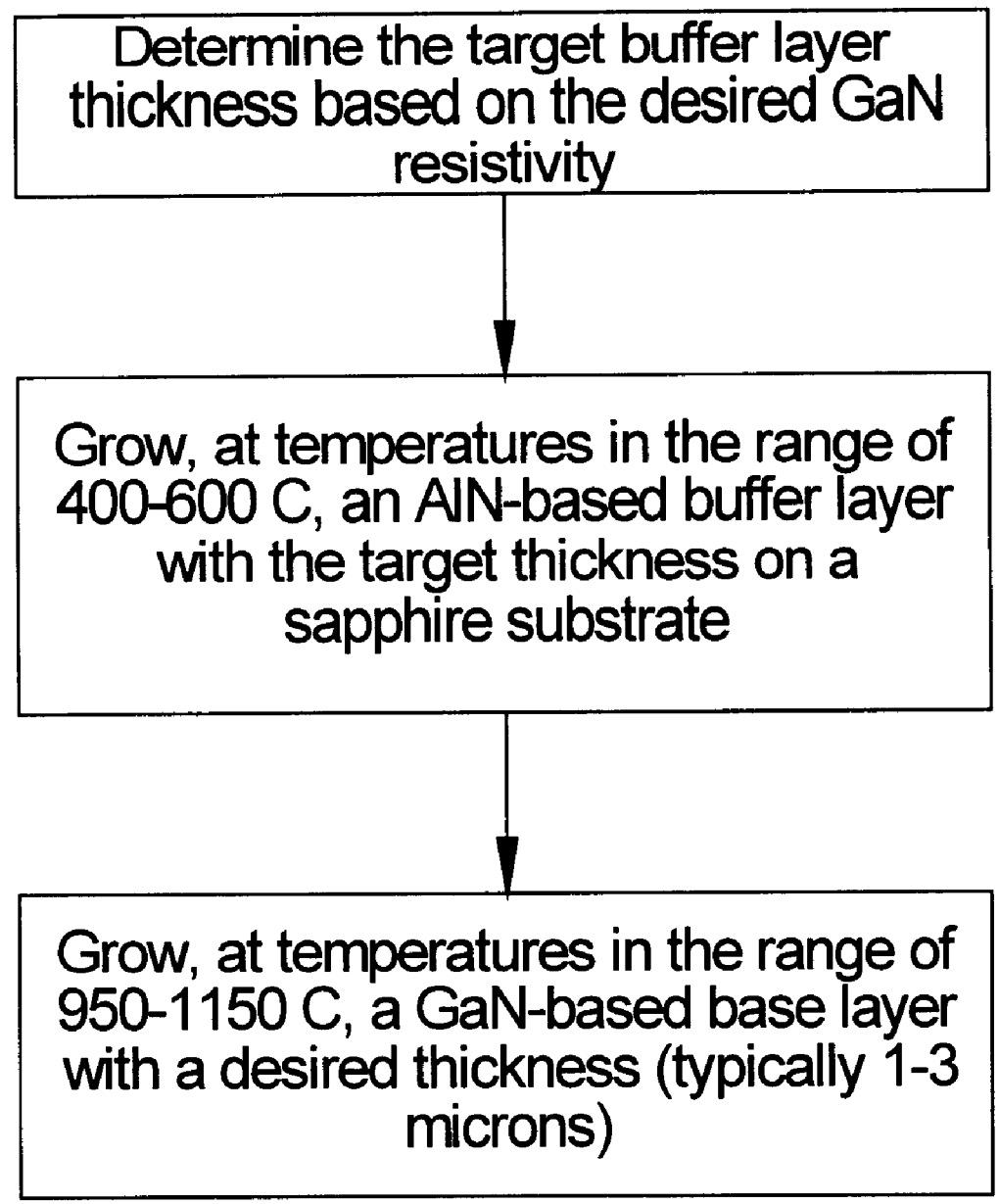
FIG. 5 shows a process to obtain a GaN layer on a sapphire substrate having a desired resistivity.

The behavior seen in the above examples shows how to design the physical structure and growth process to obtain a gallium nitride layer on a sapphire substrate having a desired resistivity. This is captured in FIG. 5, which shows a schematic flow diagram for the process.

The substitution in the process of tertiary or even more complex III–V alloys for the gallium nitride and aluminum nitride layers causes little change in the process, with minor adjustment of the buffer layer thickness being the only alteration required. Gallium nitride-based alloys shall be those where less than 20% of the group-III atoms are other than gallium, and aluminum nitride-based alloys shall be those where less than 20% of the group-III atoms are other than aluminum. The effects of substituting other group-V elements for the nitrogen are less clear, but we expect that the present invention should function as described even when a small (~5%) admixture of other group-V elements are allowed.

The deposition temperatures and rates determine the processes of dislocation creation and development in these structures. As a result, if these conditions are altered, the process must be altered to compensate. However, the basic pattern of defect structures on which the present invention depends are reasonably robust. The low temperature growth of the buffer layer on the highly mismatched sapphire substrate results in a structure having a combination of residual stress and lattice defects which result from the growing crystal adjusting to the highly defective interface during the growth process. However, little additional structural change occurs at the growth temperature after the buffer layer is complete. This means that reasonable variations in deposition rate and temperature do not alter the essential nature of the present invention.

The next step in the process of the present invention is to heat the substrate to the higher temperature that will be used for depositing the gallium nitride. During this period the mobility of lattice defects in the aluminum nitride increases to the point that essentially all lattice relaxation which will occur through the simple movement of dislocation structures driven by local stress fields will occur during this heating period. Again the result is a growth surface for the gallium nitride which is characteristic of the specific growth protocol used, but which is also robust against minor variations in that protocol.

For the reasons outlined above, small variations in the growth rate and deposition temperature used in growth of the buffer layer and the gallium nitride layer do not alter the essential nature of the result of the present invention. Small variations may be a factor of 3–4 in deposition rate, and a change of 50–100 K in growth temperature. Such changes will require that the thickness of the buffer layer be changed somewhat, but how much can be determined by growing a small number of calibration structures.

The examples and implementations described above are intended to illustrate various aspects of the present invention, not to limit the scope thereof. The scope of the invention is set by the claims interpreted in view of the specification.

What is claimed is:

1. A method for fabricating a gallium nitride-based layer having a desired resistivity atop a sapphire (0001) substrate, comprising:

a) selecting a set of process conditions for growth at a first temperature and deposition rate of an aluminum nitride-based buffer layer on the sapphire substrate, followed by growth at a second temperature and deposition rate of a gallium nitride-based base layer upon said buffer layer;

b) calculating the required thickness of said buffer layer based on said process conditions and said desired resistivity;

c) depositing the buffer layer; and d) depositing the base layer.

2. The method of claim 1, wherein the base layer consists essentially of nominally undoped gallium nitride-based material.

3. The method of claim 1, wherein the buffer layer consists essentially of nominally undoped aluminum nitride-based material.

4. The method of claim 1, wherein said base layer consists essentially of gallium nitride.

5. The method of claim 1, wherein said buffer layer consists essentially of aluminum nitride.

6. The method of claim 1, wherein the buffer layer is deposited using an MOCVD technique.

7. The method of claim 1, wherein the base layer is deposited using an MOCVD technique.

8. The method of claim 1, wherein the buffer layer is deposited at temperatures between about 400° C. and 550° C.

9. The method of claim 1, wherein the base layer is deposited at temperatures between about 800° C. and 950° C.

10. The method of claim 1, wherein the buffer layer is deposited at a rate between 0.1 nanometers/second and 1.0 nanometers/second.

11. The method of claim 1, wherein said preselected resistivity is less than 0.1 Ω-cm.

12. The method of claim 1, wherein said preselected resistivity is between 0.1 Ω-cm and 1.0 Ω-cm.

13. The method of claim 1, wherein said preselected resistivity is between 1 Ω-cm and 100 Ω-cm.

14. The method of claim 1, wherein said preselected resistivity is greater than 100 Ω-cm.

15. The method of claim 1, wherein said preselected resistivity is greater than $10^6$ Ω-cm.

16. A device fabricated using the process of claim 1.

* * * * *